United States Patent
Chan et al.

(10) Patent No.: US 8,045,675 B2
(45) Date of Patent: Oct. 25, 2011

(54) BIDIRECTIONAL SHIFT REGISTER

(75) Inventors: Chien-Ting Chan, Yongjing Township, Changhua County (TW); Hsi-Rong Han, Wurih Township, Taichung County (TW); Wen-Chun Wang, Taichung (TW)

(73) Assignees: Dongguan Masstop Liquid Crystal Display Co., Ltd., Dongguan, Guangdong Province (CN); Wintek Corporation, Taichung (TW)

( * ) Notice: Subject to any disclaimer, the term of this patent is extended or adjusted under 35 U.S.C. 154(b) by 0 days.

(21) Appl. No.: 12/839,717

(22) Filed: Jul. 20, 2010

(65) Prior Publication Data

US 2011/0026665 A1 Feb. 3, 2011

(30) Foreign Application Priority Data

Jul. 31, 2009 (TW) .................................. 98125995 A

(51) Int. Cl.
*G11C 19/00* (2006.01)

(52) U.S. Cl. .......................................... 377/64; 377/69
(58) Field of Classification Search .................... None
See application file for complete search history.

(56) References Cited

U.S. PATENT DOCUMENTS

| 5,859,630 | A * | 1/1999 | Huq ............................. 345/100 |
| 6,970,530 | B1 * | 11/2005 | Wang et al. ..................... 377/69 |
| 7,436,923 | B2 * | 10/2008 | Tobita ............................. 377/64 |
| 7,664,218 | B2 * | 2/2010 | Tobita ............................. 377/64 |
| 2007/0195920 | A1 * | 8/2007 | Tobita ............................. 377/64 |
| 2008/0101529 | A1 * | 5/2008 | Tobita ............................. 377/64 |
| 2009/0041177 | A1 * | 2/2009 | Chien et al. ..................... 377/64 |
| 2010/0150301 | A1 * | 6/2010 | Chan et al. ..................... 377/64 |

* cited by examiner

*Primary Examiner* — Tuan T Lam
(74) *Attorney, Agent, or Firm* — Thomas, Kayden, Horstemeyer & Risley, LLP

(57) ABSTRACT

A bi-directional shift register includes N stages, wherein the $m^{th}$ stage among the N stages includes a node, an output end, first input circuit, second input circuit, and a shift register unit. N is a natural number greater than 1 and m is a natural number smaller than or equal to N. First control signal is measured on the node. The output end outputs an $m^{th}$ output signal. The first input circuit receives an $m-1^{th}$ output signal as a control signal and a power signal to accordingly generate an enabled first driving signal to the node in first period. The second input circuit receives an $m+1^{th}$ output signal as a control signal and a power signal to accordingly generate an enabled second driving signal to the node in second period. Controlled by the first control signal, the shift register unit generates an $m^{th}$ output signal in third period.

7 Claims, 5 Drawing Sheets

BIDIRECTIONAL SHIFT REGISTER

This application claims the benefit of Taiwan application Serial No. 098125995, filed Jul. 31, 2009, the subject matter of which is incorporated herein by reference.

BACKGROUND OF THE INVENTION

1. Field of the Invention

The invention relates in general to a shift register, and more particularly to a bi-directional shift register capable of performing bi-directional shift operations.

2. Description of the Related Art

According to the current technology, most scan drivers are implemented by shift registers to provide scan signals, which are sequentially enabled along a first direction, to perform scan operation on a number of pixel rows of a pixel array. However, in many implementations, shift registers are expected to further flexibly provide the scan signals, which are sequentially enabled along a second direction opposite to the first direction. Thus, how to design a bi-directional shift register capable of flexibly performing shift operation along different directions in response to different control signals has become a focus to the manufacturers.

SUMMARY OF THE INVENTION

The invention is directed to a bi-directional shift register. The output signals and the previous and the next stage of the current stage circuits of the bi-directional shift register are used as a control signal and a power signal to accordingly generate a control signal to drive the current stage circuit performing the output operation to shift signals forward or backward. Thus, compared with a conventional shift register, the bi-directional shift register of the invention has the advantages of performing output operations of forward and backward shift signals shifting and achieving lower cost.

According to a first aspect of the present invention, a bi-directional shift register is provided. The bi-directional shift register is used for outputting N output signals along a first shifting direction or outputting N output signals along a second shifting direction. The bi-directional shift register includes N stages, wherein N is a natural number greater than 1. The $m^{th}$ stage of the N stage circuit includes a first node, an output end, a first input circuit, a second input circuit and a shift register unit. The first node has a first control signal. The output end is for outputting the $m^{th}$ stage output signal. The first input circuit is coupled to an $(m-1)^{th}$ stage output end to receive the $(m-1)^{th}$ stage output signal. The first input circuit receives an $(m-1)^{th}$ stage output signal as a control signal and a power signal to accordingly generate an enabled first driving signal to the first node in the first period. The second input circuit is coupled to the $(m+1)^{th}$ stage output end to receive the $(m+1)^{th}$ stage output signal. The second input circuit receives an $(m+1)^{th}$ stage output signal as a control signal and a power signal to accordingly generate an enabled second driving signal to the first node in the second period. The shift register unit is controlled by a first control signal equal to one of the enabled first driving signal and the enabled second driving signal to generate an enabled $m^{th}$ stage output signal in the third period, wherein m is a natural number smaller than or equal to N.

The invention will become apparent from the following detailed description of the preferred but non-limiting embodiments. The following description is made with reference to the accompanying drawings.

DETAILED DESCRIPTION OF THE INVENTION

Figure 1:
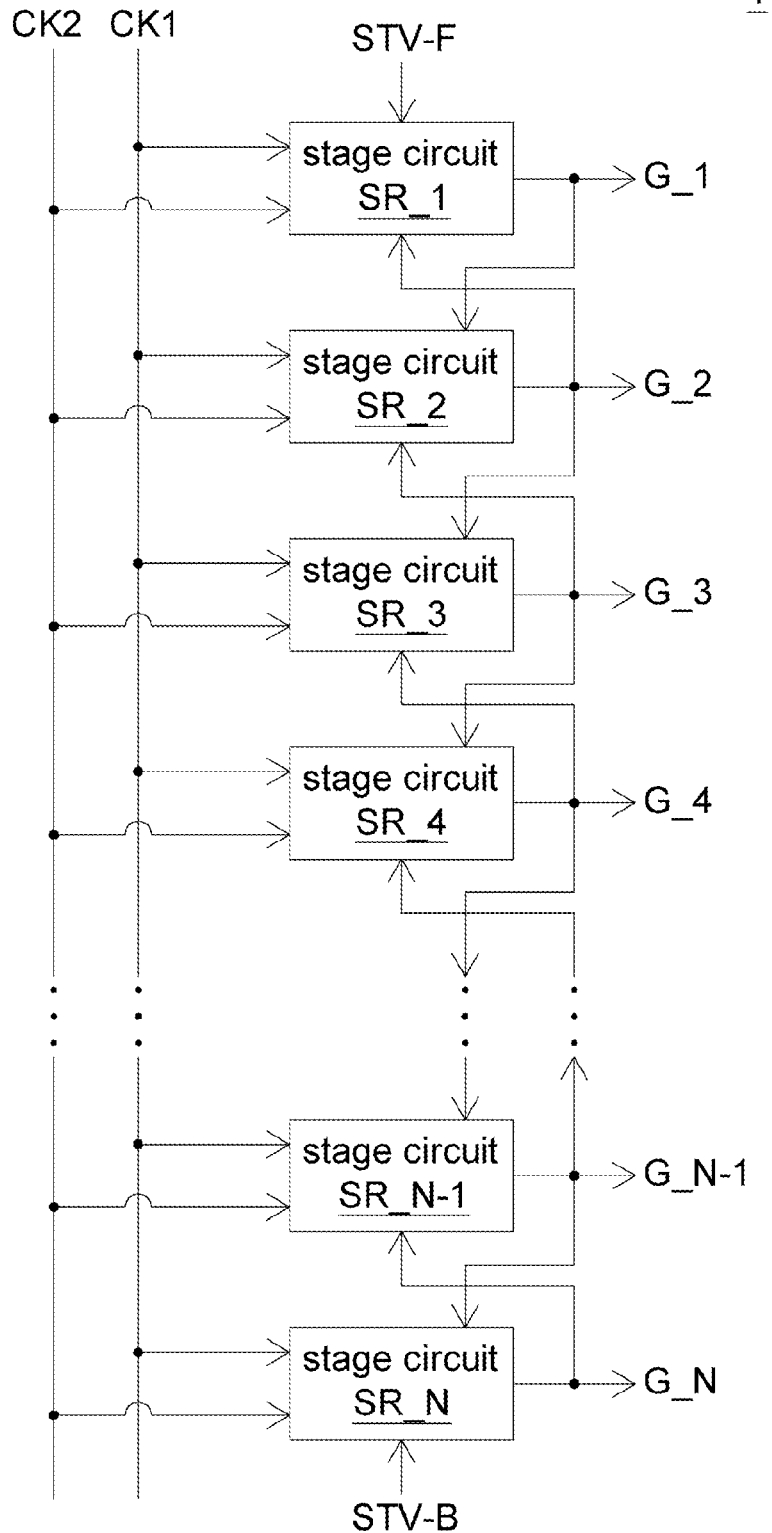
FIG. 1 shows a circuit diagram of a bi-directional shift register according to an embodiment of the invention.

Referring to FIG. 1, a circuit diagram of a bi-directional shift register according to an embodiment of the invention is shown. The bi-directional shift register 1 includes N stage circuits SR_1, SR_2, ..., SR_N respectively providing N output signals G_1, G_2, ..., G_N, wherein N is a natural number greater than 1. Each of the stage circuits SR_1-SR_N within the bi-directional shift register 1 provides an output signal according to one of the output signals provided by a previous stage circuit and a next stage circuit.

Figure 2A:
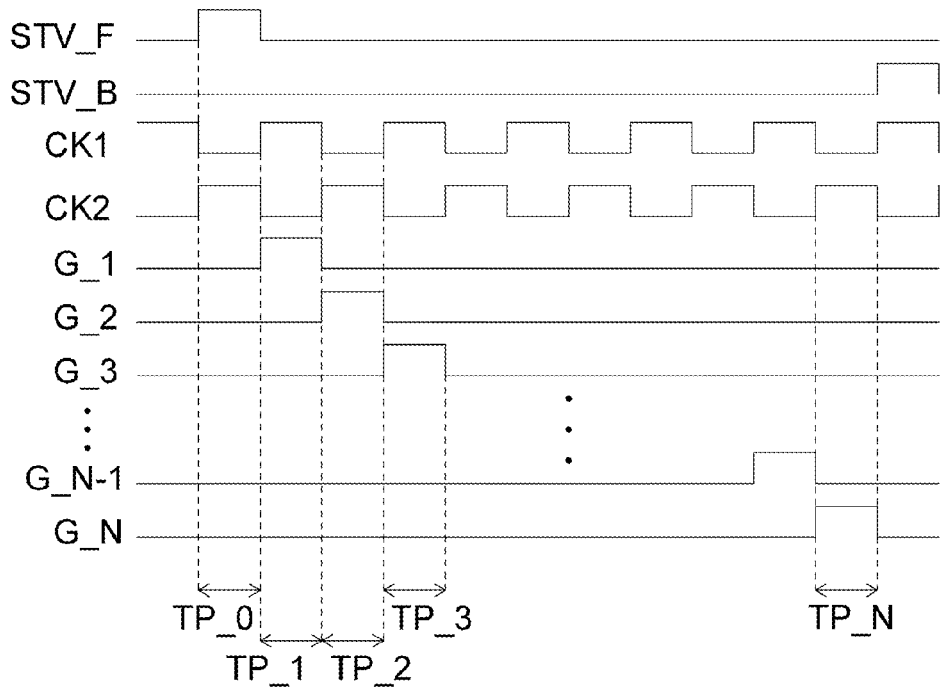
FIG. 2A shows a timing diagram of an output signal of the shift register according to an embodiment of the invention.

Referring to FIG. 2A, a timing diagram of an output signal of the shift register according to an embodiment of the invention is shown. In an operating example, the stage circuit SR_1 is controlled by a forward start signal STV_F enabled in the period TP_0 to generate an enabled output signal G_1 in the period TP_1, and the stage circuits SR_2-SR_N following the stage circuit SR_1 correspondingly respond to the output signal G_1-G_N−1 provided by the previous stage circuit to generate corresponding output signals G_2-G_N in corresponding operation periods TP_2-TP_N. In this operating example, the shift register 1 responds to the forward start signal STV_F to perform output operation of providing forward shift signal.

Figure 2B:
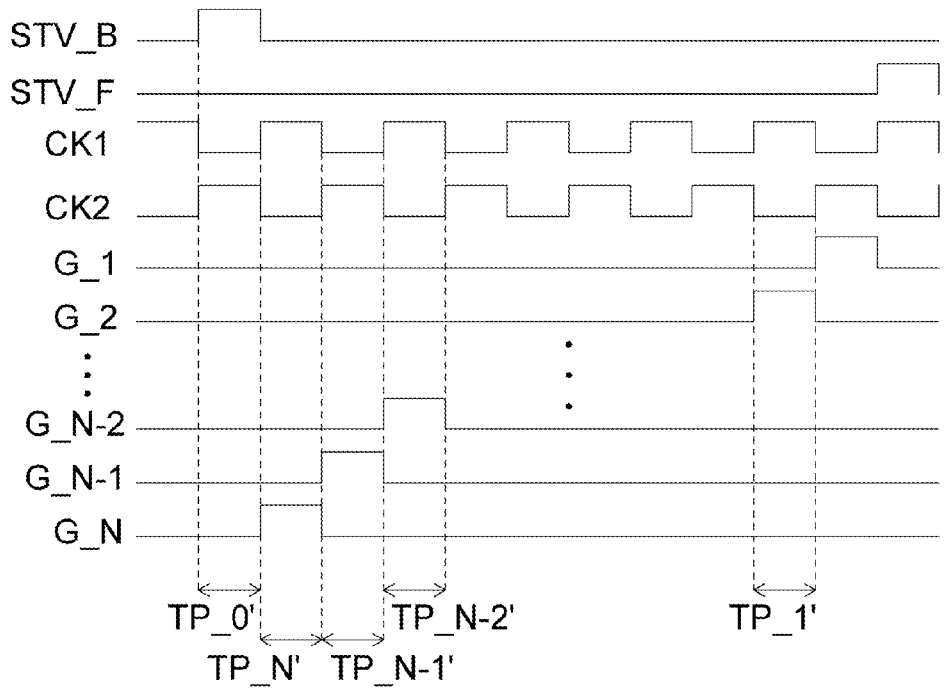
FIG. 2B shows another timing diagram of an output signal of the shift register according to an embodiment of the invention.

Referring to FIG. 2B, another timing diagram of an output signal of the shift register according to an embodiment of the invention is shown. In another operating example, the stage circuit SR_N is controlled by an inverse start signal STV_B enabled in the period TP_0' to generate an enabled output signal G_N in the period TP_N', and the stage circuits SR_N−1-SR_1 prior to the stage circuit SR_N correspondingly respond to the output signals G_N-G_2 provided by the next stage circuit to generate corresponding output signals G_N−1-G_1 of the current stage in corresponding operation periods TP_N−1'-TP_1. In this operating example, the shift register 1 performs output operation to an inverse shift signal in response to the inverse start signal STV_B.

As each of the stage circuits SR_1-SR_N has a similar circuit structure and operation, an $m^{th}$ stage circuit SR_m between the first stage and the $N^{th}$ stage of the N stages is exemplified below for elaborating the detailed circuits, and the detailed circuit structures of remaining stage circuits SR_1-SR_N and the operations thereof can be obtained in the same way, wherein m is a natural number smaller than or equal to N.

Figure 3:
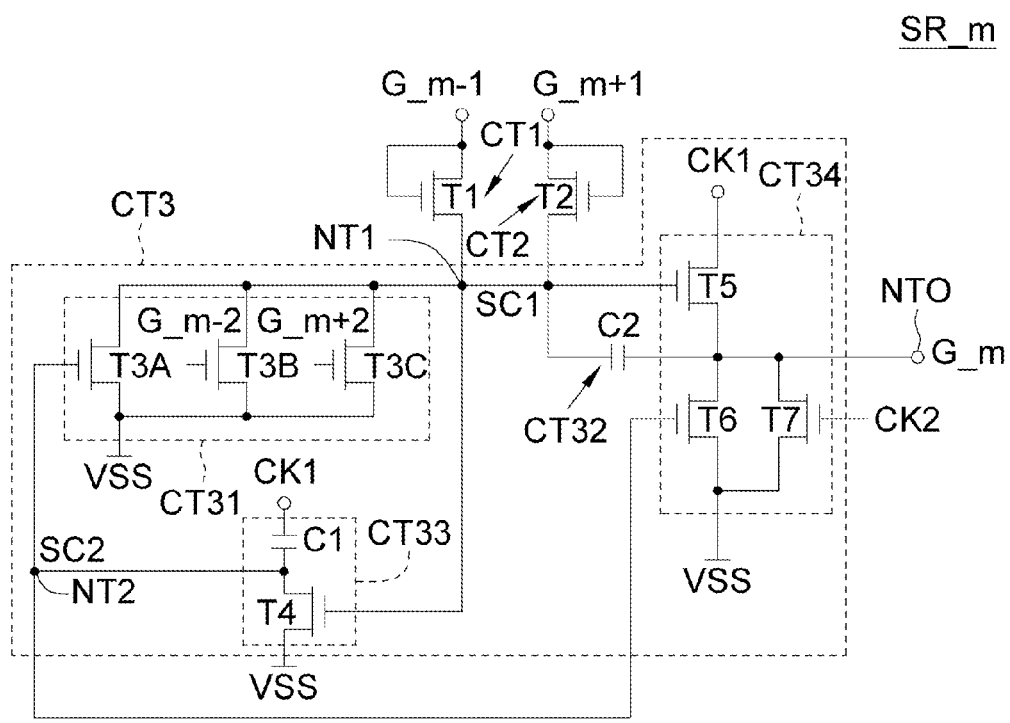
FIG. 3 shows a detailed circuit diagram of the stage circuit SR_m of FIG. 1.

Referring to FIG. 3, a detailed circuit diagram of the stage circuit SR_m of FIG. 1 is shown. The stage circuit SR_m includes two nodes NT1 and NT2, an output end NTO, two input circuits CT1 and CT2 and a shift register unit CT3. The nodes NT1 and NT2 respectively have the control signals SC1 and SC2 disposed thereon. The output end NTO is for providing an output signal G_m.

The input circuit CT1 is coupled to the output end of the stage circuit SR_m−1 to receive an output signal G_m−1 from the stage circuit SR_m−1. The input circuit CT1 receives the output signal G_m−1 as a control signal and a power signal to accordingly generate an enabled first driving signal to the node NT1 in the first period so as to enable the control signal SC1 in the first period. The input circuit CT1 of the stage circuit SR_1 is coupled to the start signal STV_F. The input circuit CT1 of the stage circuit SR_2 is coupled to the output end of the stage circuit SR_1 to receive the output signal G_1 of the stage circuit SR_1, and other stage circuits SR_m−1 can be obtained in the same way.

In an exemplary implementation, the input circuit CT1 of the stage circuit SR_m includes a transistor T1. The transistor T1 is implemented by an N-type metal oxide semiconductor (NMOS) transistor for example, wherein the drain and the gate of the transistor T1 are coupled to the output end of the stage circuit SR_m−1 to receive output signal G_m−1, and the source of the transistor T1 is coupled to the node NT1.

The input circuit CT2 is coupled to the output end of the stage circuit SR_m+1 to receive an output signal G_m+1. The input circuit CT2 receives the output signal G_m+1 as a control signal and a power signal to accordingly generate an enabled second driving signal to the node NT1 in the second period so as to enable the control signal SC1 in the second period. The input circuit CT2 of the $N^{th}$ stage circuit SR_N is coupled to the start signal STV_B. The input circuit CT2 of the $(N-1)^{th}$ stage circuit SR_N−1 is coupled to the output end of the stage circuit SR_N of the $N^{th}$ stage to receive the output signal G_N from the stage circuit SR_N, and other stage circuits SR_m−1 can be obtained in the same way.

In an exemplary implementation, the input circuit CT2 includes a transistor T2. The transistor T2 is implemented by an NMOS transistor for example, wherein the drain and the gate of the transistor T1 are coupled to the output end of the stage circuit SR_m+1 to receive an output signal G_m+1, and the source of the transistor T1 is coupled to the node NT1.

In an exemplary implementation, the shift register unit CT3 includes a control circuit CT31, a coupling circuit CT32, a bias circuit CT33 and an output stage circuit CT34.

In an exemplary implementation, the control circuit CT31 includes three transistors T3A, T3B and T3C respectively implemented by an NMOS transistor for example. The drains of the transistors T3A-T3C are coupled to the node NT1. The sources of the transistors T3A-T3C receive a reference voltage signal VSS. Besides, the gates of the transistors T3A-T3C are respectively coupled to the node NT2, the output end of the $(m-2)^{th}$ stage circuit and the output end of the $(m+2)^{th}$ stage circuit. For example, the reference voltage signal VSS is a low voltage signal of the bi-directional shift register 1.

In an exemplary implementation, the coupling circuit CT32 includes a capacitor C2, wherein the two ends of the capacitor C1 are respectively coupled to the node NT1 and the output end NTO.

In an exemplary implementation, the bias circuit CT33 includes a transistor T4 and a capacitor C1, wherein the transistor T4 is implemented by an NMOS transistor for example. The first source/drain of the transistor T4 are coupled to the node NT2, the gate of the transistor T4 is coupled to the node NT1, the second source/drain of the transistor T4 receive the reference voltage signal VSS, and the capacitor C1 has two ends respectively receiving a pulse signal CK1 and coupled to the node NT2.

In an exemplary implementation, the output stage circuit CT34 includes three transistors T5, T6 and T7, wherein each of the transistors T5-T7 is implemented by an NMOS transistor for example. The first source/drain of the transistor T5 receive a pulse signal CK1, the gate of the transistor T5 is coupled to the node NT1, the second source/drain of the transistor T5 is coupled to the output end NTO. The drains of the transistors T6 and T7 are coupled to the output end NTO, the sources of the transistors T6 and T7 receive the reference voltage signal VSS, the gates of the transistors T6 and T7 are respectively coupled to the node NT2 and receive a pulse signal CK2. The pulse signals CK2 and the CK1 are inverse to each other for example.

Figure 4:
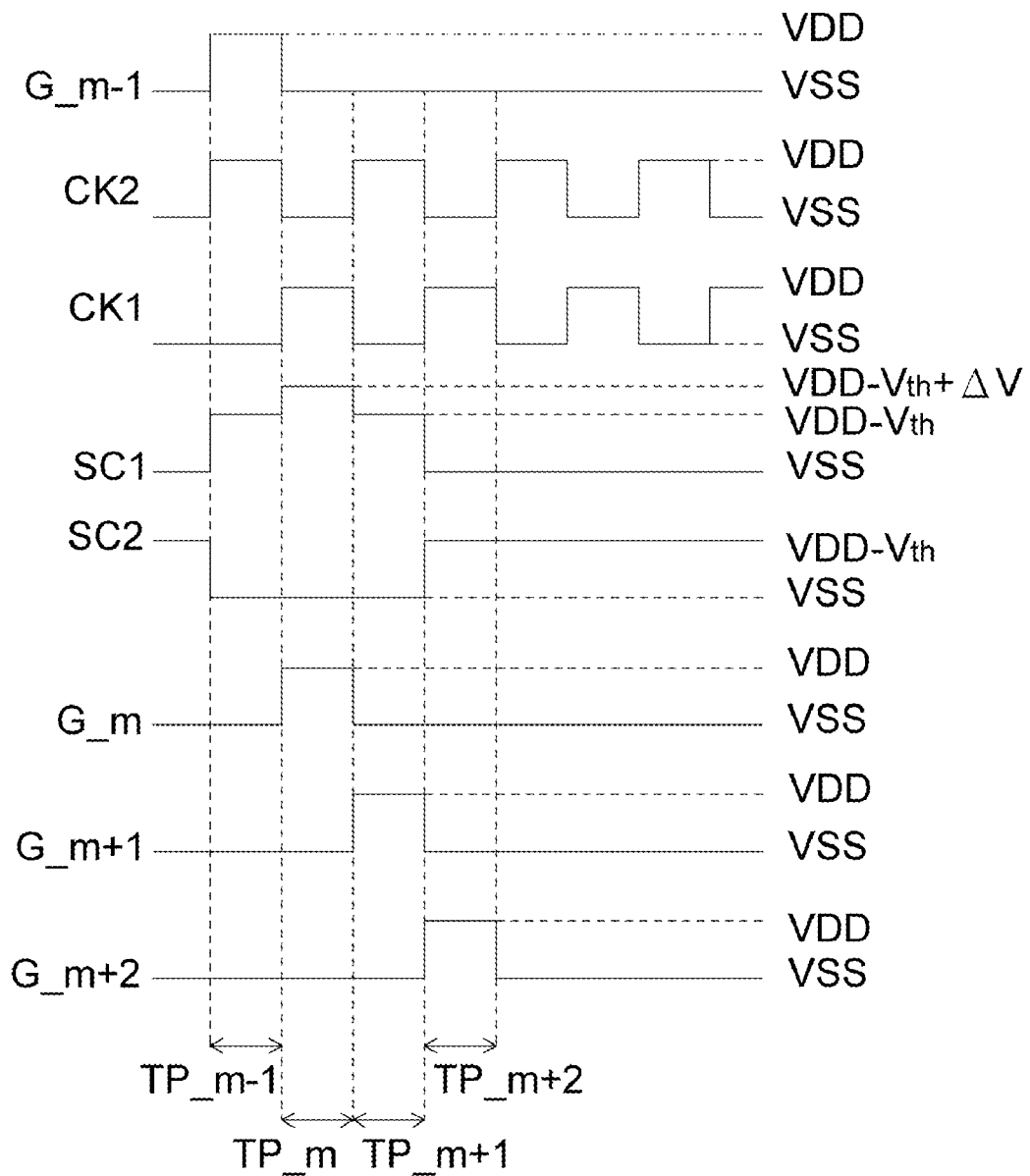
FIG. 4 shows a timing diagram of a related signal of the stage circuit SR_m of FIG. 3.

Referring to FIG. 4, a timing diagram related to the stage circuit SR_m of FIG. 3 is shown. In an operating example, the stage circuit SR_m responds to the output signal G_m−1 of the previous stage circuit (that is, the stage circuit SR_m−1) to accordingly generate an output signal G_m. In other words, the stage circuit SR_m performs output operation of providing to forward shift signal.

In the period TP_m−1, the output signal G_m−1 is enabled and equal to a reference voltage signal VDD, and the pulse signals CK1 and CK2 are respectively equal to the reference voltage signal VSS and the reference voltage signal VDD. For example, the reference voltage signal VDD is a high level voltage signal of the bi-directional shift register 1. Thus, the input circuit CT1 is turned on so that the control signal SC1 is equal to high level VDD-Vth1, wherein the voltage Vth1 is a threshold voltage of the transistor T1. The transistor T4 of the bias circuit CT33 is controlled by the control signal SC1 having the high level VDD-Vth1 so that the control signal SC2 is equal to the reference voltage VSS to turn off the transistor T6. The transistors T7 and T5 of the output stage circuit CT34 are respectively controlled to be turned on by the control signal SC1 equal to the reference voltage signal (that is, the control signal SC1 is enabled) and the pulse signal CK2 so as to further respectively control the output signal G_m to be equal to the reference voltage signal VSS and the pulse signal CK1 (also equal to the reference voltage signal VSS).

In the period TP_m, both the output signal G_m−1 and the G_m+1 are equal to the reference voltage signal VSS, the pulse signal CK1 is switched to the high level equal to the reference voltage signal VDD from the low level equal to the reference voltage signal VSS. The pulse signal CK2 is switched to the low level equal to the low level reference voltage signal VSS from the high level equal to the reference voltage signal VDD. Thus, the input circuits CT1, CT2 and the control circuit CT31 are all turned off, so that the node NT1 is floating and the control signal SC1 is temporarily equal to the high level VDD-Vth1. Thus, controlled by the bias circuit CT33, the control signal SC2 is still kept at the low level equal to the reference voltage VSS, and the transistor T6 is continually turned off. The transistor T7 is controlled by the pulse signal CK2 to be turned off.

Besides, in the period TP_m, the capacitor C2, in response to the pulse signal CK1 being pulled up to a high level from a low level, couples the delta voltage ΔV to the control signal SC1 at the node NT1 which corresponds to a high voltage level VDD-Vth1, so that the control signal SC1 has a capacitor coupling level:

$$VC1 = VDD - Vth1 + \Delta V$$

For example, the delta voltage ΔV is expressed as:

$$\Delta V = \frac{C_{gs}}{C_{p1} + C_{gs}}(VDD - VSS)$$

Wherein the capacitor Cgs is an internal parasitic capacitor of the transistor T5 and the capacitor Cp1 is an equivalent capacitor viewed from the node NT1. Thus, the transistor T5 is controlled and turned on by the control signal SC1 of the capacitor coupling level so that the output signal G_m is equal to the reference voltage signal VDD.

In the period TP_m+1, the output signals G_m−1 and G_m+1 are respectively equal to the reference voltage signal VSS and the reference voltage signal VDD, and the pulse signals CK1 and CK2 are respectively equal to the reference voltage signal VSS and the reference voltage signal VDD. Thus the input circuit CT2 is turned on so that the control signal SC1 is equal to the high level VDD-Vth, and the control signal SC2 is continually equal to the reference voltage signal VSS. The transistor T5 is controlled by the control signal SC1 to have a high level, so that the output signal G_m is equal to the pulse signal CK1 (also equal to the reference voltage signal VSS). The transistor T7 is also controlled and turned on by the pulse signal CK2 equal to the reference voltage signal VDD, so that the output signal G_m is equal to the reference voltage signal VSS.

In the period TP_m+2, both the output signals G_m−1 and the G_m+1 are equal to the reference voltage signal VSS, the output signal G_m+2 is equal to the reference voltage signal VDD, and the pulse signal CK1 is switched to the high level equal to the reference voltage signal VDD from the low level equal to the reference voltage signal VSS, the pulse signal CK2 is switched to the low level equal to the reference voltage signal VSS from the high level equal to the reference voltage signal VDD. The transistor T4 of the bias circuit CT33 is controlled and turned off by the control signal SC1 equal to the reference voltage signal VSS. In response to the coupling operation of the rising edge of the pulse signal CK1 through the capacitor C1, the control signal SC2 is equal to the reference voltage signal VDD to turn on the transistors T3A and T6. The transistor T6 of the output stage circuit CT34 is controlled and turned on by the control signal SC2 equal to the reference voltage signal VDD to control the output signal G_m to be equal to the reference voltage signal VSS.

Thus, after the operation of the periods TP_m−1-TP_m+2, the stage circuit G_m can effectively provide an output signal G_m in response to the output signal G_m−1.

Figure 5:
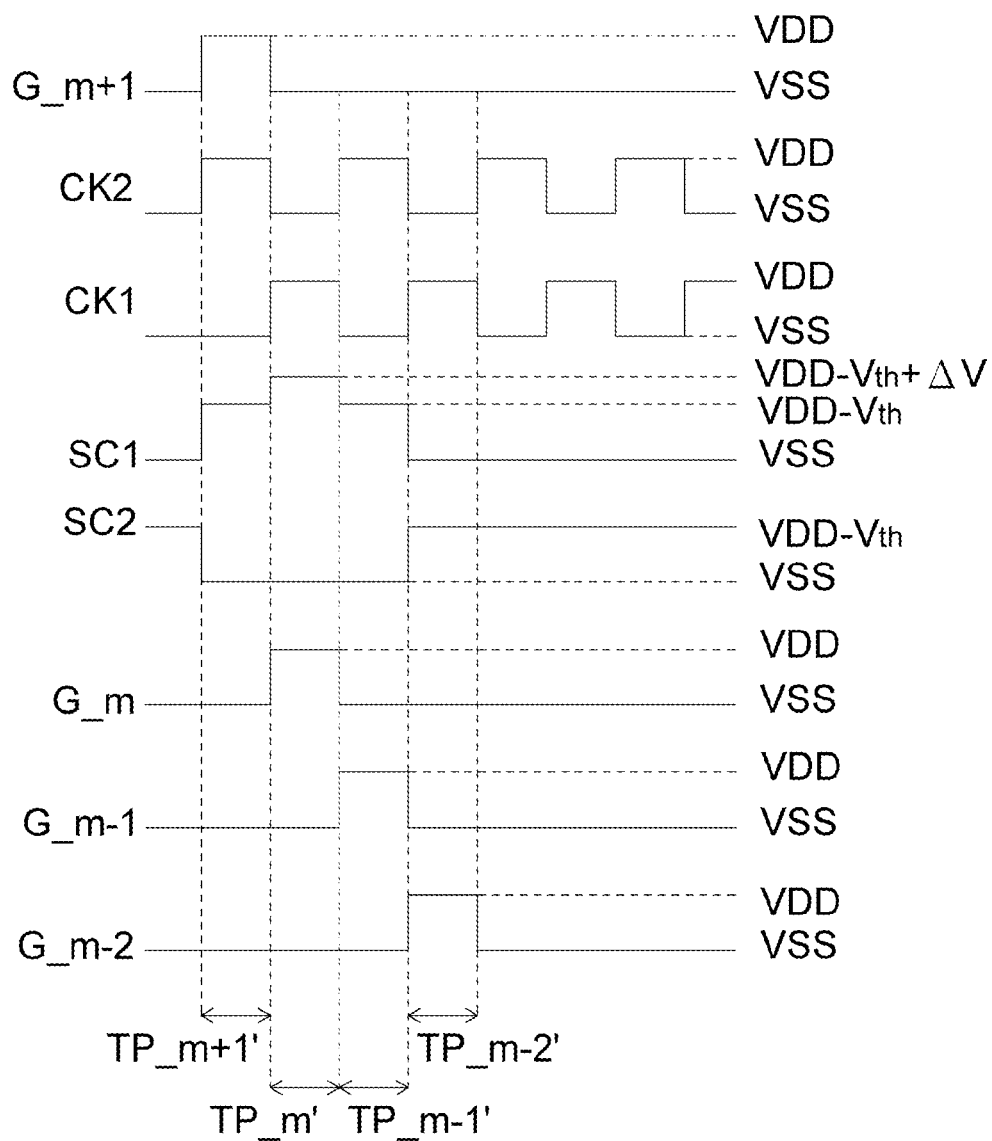
FIG. 5 shows another timing diagram of a related signal of the stage circuit SR_m of FIG. 3.

Referring to FIG. 5, another timing diagram related to the stage circuit SR_m of FIG. 3 is shown. In another operating example, the stage circuit SR_m accordingly generates an output signal G_m in response to the output signal G_m+1 of the next stage circuit (that is, the stage circuit SR_m+1). In other words, the current stage circuit SR_m performs output operation of providing to backward shift signal. The output operation performed on backward shift signal by the stage circuit SR_m is similar to the output operation performed on forward shift signal by the stage circuit SR_m, and the detailed circuit operations are not repeated elaborated here.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A bi-directional shift register for outputting N output signals along a first shifting direction or outputting the N output signals along a second shifting direction, wherein the bi-directional shift register comprises N stages, N is a natural number greater than 1, and an mth stage circuit among the N stages comprises:
    a first node having a first control signal;
    an output end for outputting an output signal of the mth stage;
    a first input circuit coupled to the output end of an (m−1)th stage to receive the output signal of the (m−1)th stage, wherein the first input circuit receives the output signal of the (m−1)th stage as a control signal and a power signal to accordingly generate an enabled first driving signal to the first node in a first period;
    a second input circuit coupled to the output end of an (m+1)th stage to receive the output signal of the (m+1)th stage, wherein the second input circuit receives the output signal of the (m+1)th stage as a control signal and a power signal to accordingly generate an enabled second driving signal to the first node in a third period; and
    a shift register unit controlled by the first control signal corresponding to one of the enabled first driving signal and the enabled second driving signal to accordingly generate the enabled output signal of the mth stage in a second period, wherein m is a natural number smaller than or equal to N;
    wherein the shift register unit comprises:
        a control circuit controlled by the output signal of an (m+2)$^{th}$ stage, the output signal of an (m−2)$^{th}$ stage and a second control signal for controlling the first control signal to have a disabling level in the third period;
        a coupling circuit controlled by a rising edge of a first pulse signal for controlling the first control signal to have a capacitor coupling level in the second period;
        a bias circuit controlled by the first control signal for controlling the second control signal to have a disabling level in the first and the second period and controlling the second control signal to have an enabling level in the third period; and
        an output stage circuit controlled by the first control signal at the high voltage capacitor coupling level for enabling the output signal of the mth stage in the second period and controlled by the second control signal for disabling the output signal of the mth stage in the third period.

2. The bi-directional shift register according to claim 1, wherein when the first period is activated before the second period, the shift register unit responds to the first control signal equal to the first driving signal to generate the enabled output signal of the m$^{th}$ stage in the third period, the shift register unit further responds to the second driving signal to generate the disabled output signal of the mth stage in the second period.

3. The bi-directional shift register according to claim 1, wherein the control circuit comprises:
    a transistor, wherein the first output end receives the first control signal, the second output end receives a reference voltage, and the control end receives the second control signal;
    a second transistor wherein the first output end receives the first control signal, the second output end receives the reference voltage, and the control end receives the output signal of the (m−2)th stage; and a third transistor wherein the first output end receives the first control signal, the second output end receives the reference voltage, and the control end receives the output signal of the (m+2)th stage.

4. The bi-directional shift register according to claim 1, wherein the bias circuit comprises:

a second node having the second control signal;

a capacitor wherein the first end receives the first pulse signal, and second end is coupled to the second node; and a transistor wherein the first output end is coupled to the second node, the second output end receives a reference voltage, and the control end receives the first control signal.

5. The bi-directional shift register according to claim 1, wherein the output stage circuit comprises:

a first transistor wherein the first output end receives the first pulse signal, the second output end is coupled to the output end, and the control end receives the first control signal; and a second transistor wherein the first output end is coupled to the output end, the second output end receives a reference voltage, and the control end receives the second control signal.

6. The bi-directional shift register according to claim 5, wherein the output stage circuit further comprises:

a third transistor wherein the first output end is coupled to the output end, the second output end receives the reference voltage, the control end receives a second pulse signal, and the first and the second pulse signal are inverse to each other.

7. The bi-directional shift register according to claim 1, wherein when the third period is activated before the first period, the shift register unit responds to the first control signal equal to the enabled second driving signal to generate the enabled output signal of the mth stage in the second period.

* * * * *